US009749739B2

(12) United States Patent
Tang et al.

(10) Patent No.: US 9,749,739 B2
(45) Date of Patent: Aug. 29, 2017

(54) PROTECTION OF A SPEAKER FROM THERMAL DAMAGE

(71) Applicant: Qualcomm Incorporated, San Diego, CA (US)

(72) Inventors: Zhilong Tang, Irvine, CA (US); Jingxue Lu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/858,306

(22) Filed: Sep. 18, 2015

(65) Prior Publication Data

US 2017/0085986 A1 Mar. 23, 2017

(51) Int. Cl.

*H03G 11/00* (2006.01)
*H04R 3/00* (2006.01)
*H04R 29/00* (2006.01)

(52) U.S. Cl.

CPC .......... *H04R 3/007* (2013.01); *H04R 29/001* (2013.01); *H04R 2203/00* (2013.01); *H04R 2430/01* (2013.01)

(58) Field of Classification Search

CPC .... H04R 3/007; H04R 29/003; H04R 29/001; H04R 9/022; H04R 2430/01; H04R 2499/11; H04R 3/00; H04R 2209/041; H04R 3/002; H04R 1/00; H04R 9/046; H04R 9/06; H04R 2209/024; H04R 2420/07; H04R 3/02; H04R 3/04; H04R 3/14; H04R 7/12; H04R 2499/13; H04R 9/025; H04R 1/1041; H04R 1/26; H04R 1/2803; H04R 1/403

USPC ......... 381/55, 59, 58, 96, 56, 120, 107, 121, 381/189, 397, 111, 118, 28, 98, 99, 123, 381/182, 386, 407, 100, 116, 17, 335, 381/345, 354, 401, 409, 421, 61, 74, 81, 381/85

See application file for complete search history.

(56) References Cited

U.S. PATENT DOCUMENTS

| | | | | |
|---|---|---|---|---|
| 4,093,822 | A * | 6/1978 | Steinle | H04R 3/007 361/58 |
| 6,421,626 | B1 | 7/2002 | Yin | |
| 8,111,095 | B2 | 2/2012 | Vorenkamp et al. | |
| 8,401,207 | B2 | 3/2013 | Stanley | |
| 8,817,995 | B2 | 8/2014 | Huijser et al. | |

(Continued)

OTHER PUBLICATIONS

International Search Report and Written Opinion—PCT/US2016/048015—ISA/EPO—Nov. 9, 2016.

(Continued)

*Primary Examiner* — Akelaw Teshale
(74) *Attorney, Agent, or Firm* — Foley & Lardner LLP

(57) ABSTRACT

A method of protecting a speaker from thermal damage includes determining a first load current through a first resistor that is coupled to the speaker. The method also includes converting the first load current to a digital value using a second load current through a second resistor as a reference input. The second resistor is part of a circuit that reduces an effect of a temperature coefficient of resistance of the first resistor. The method also includes comparing the digital value of the first load current to a threshold value. The method further includes, responsive to the first load current being larger than the threshold value, generating an instruction to take an action to protect the speaker.

30 Claims, 3 Drawing Sheets

(56) References Cited

U.S. PATENT DOCUMENTS

| | | | | |
|---|---|---|---|---|
| 9,008,333 | B2 | 4/2015 | Quilter | |
| 2002/0146135 | A1 * | 10/2002 | Howze | H04R 3/007 381/55 |
| 2004/0178852 | A1 * | 9/2004 | Neunaber | H03F 1/52 330/284 |
| 2009/0257599 | A1 * | 10/2009 | Sand Jensen | H03F 1/52 381/55 |
| 2012/0020488 | A1 * | 1/2012 | Huijser | H04R 3/007 381/59 |
| 2012/0140932 | A1 * | 6/2012 | Tang | H04R 3/007 381/55 |
| 2013/0223649 | A1 * | 8/2013 | Srivastava | H03F 1/523 381/104 |
| 2014/0086418 | A1 * | 3/2014 | Lubberhuizen | H04R 9/022 381/55 |
| 2014/0254805 | A1 * | 9/2014 | Su | H04R 3/007 381/55 |
| 2015/0215704 | A1 * | 7/2015 | Magrath | H04R 9/022 381/55 |
| 2016/0105746 | A1 * | 4/2016 | Berthelsen | H04R 3/007 381/55 |

OTHER PUBLICATIONS

Overton D: "New Circuit Protection Devices for Loudspeaker Systems", Elektor Electronics, Elektor Electronics, GB, vol. 15, No. 16, Apr. 1, 1989 (Apr. 1, 1989), p. 24/25, XP000045692 ISSN: 0268-4519.

* cited by examiner

PROTECTION OF A SPEAKER FROM THERMAL DAMAGE

BACKGROUND

Speakers are electronic devices that are used to convert electrical signals into audible sound. Speakers are commonly used in homes, vehicles, businesses, etc. for listening to music and other media. Traditional speakers are powered by a load current, and include an electromagnet that is able to move, a permanent magnet that is immobile, and a cone portion. Upon receipt of the load current, a direction of the magnetic field of the electromagnet changes rapidly. The rapid change in the direction of the magnetic field causes the electromagnet to be alternately attracted to and repelled away from the permanent magnet, which results in vibrations of the electromagnet. The cone portion of the speaker, which is attached to the electromagnet, amplifies the vibrations of the electromagnet, thereby generating sound waves. One general limitation of speakers is their fragility. For example, a speaker can be permanently damaged if components of the speaker are exposed to excessive heat. Such excessive heat can be generated in part by the load current that powers the speaker.

SUMMARY

A method of protecting a speaker from thermal damage includes determining a first load current through a first resistor that is coupled to the speaker. The method also includes converting the first load current to a digital value using a second load current through a second resistor as a reference input. The second resistor is part of a circuit that reduces an effect of a temperature coefficient of resistance of the first resistor. The method also includes comparing the digital value of the first load current to a threshold value. The method further includes, responsive to the first load current being larger than the threshold value, generating an instruction to take an action to protect the speaker.

A circuit for protecting a speaker from thermal damage includes an analog to digital converter and a controller. The analog to digital converter is configured to receive a first load current that flows through a first resistor that is coupled to the speaker and a second load current that flows through a second resistor. The second resistor reduces an effect of a temperature coefficient of resistance of the first resistor. The analog to digital converter is also configured to convert the first load current to a digital value with the second load current as a reference value. The analog to digital converter is also configured to compare the digital value of the first load current to a threshold value. Responsive to the first load current being larger than the threshold value, the analog to digital converter is configured to generate an instruction to take an action to protect the speaker. The controller is configured to receive the instruction from the analog to digital converter and to perform the action.

An apparatus for protecting a speaker from thermal damage includes means for determining a first load current through a first resistor that is coupled to the speaker. The apparatus also includes means for converting the first load current to a digital value, where the means for converting is configured to use a second load current through a second resistor as a reference value. The second resistor is part of a circuit that reduces an effect of a temperature coefficient of resistance of the first resistor. The apparatus also includes means for comparing the digital value of the first load current to a threshold value. The apparatus further includes means for generating an instruction to take an action to protect the speaker, responsive to the first load current being larger than the threshold.

A non-transitory computer-readable medium has computer-readable instructions stored thereon. The computer-readable instructions include instructions to determine a first load current through a first resistor that is coupled to the speaker. The computer-readable instructions also include instructions to convert the first load current to a digital value using a second load current through a second resistor as a reference input. The second resistor is part of a circuit that reduces an effect of a temperature coefficient of resistance of the first resistor. The computer-readable instructions also include instructions to compare the digital value of the first load current to a threshold value. The computer-readable instructions further include instructions to take, responsive to the first load current being larger than the threshold value, an action to protect the speaker.

The foregoing is a summary of the disclosure and thus by necessity contains simplifications, generalizations, and omissions of detail. Consequently, those skilled in the art will appreciate that the summary is illustrative only and is not intended to be in any way limiting. Other aspects, features, and advantages of the devices and/or processes described herein, as defined by the claims, will become apparent in the detailed description set forth herein and taken in conjunction with the accompanying drawings.

DETAILED DESCRIPTION

A speaker is susceptible to damage from excessive heat if the load current delivered to the speaker is too high. A traditional method of protecting the speaker involves sensing the load current through the speaker using an on-chip resistor, and turning the speaker off or reducing the load current if the sensed load current exceeds a threshold. However, the on-chip resistor used to detect load current has an inherent temperature coefficient of resistance that causes the actual resistance of the on-chip resistor to increase as the temperature of the on-chip resistor increases due to the load current running through it. This increase in resistance results in an inaccurate measurement of the load current, which makes it difficult to accurately control the load current to avoid thermal damage to the speaker. The subject matter described herein resolves this problem by significantly reducing the effect that the temperature coefficient of resistance of the on-chip resistor has on load current measurement. As discussed in more detail below, this is done in part by introducing into the sensing system a circuit loop that includes a second on-chip resistor having the same temperature coefficient as the on-chip resistor connected or otherwise coupled to the speaker.

The subject matter described herein also addresses the process variation that results during the manufacture of electrical components such as resistors and capacitors. It is often the case that the actual value of an electrical component varies significantly from the stated value of the electrical component. This variation can be up to approximately 20% of the stated value of the electrical component. For example, a manufactured resistor may have a stated value of 100 Ohms and an actual value of anywhere between 80-120 Ohms. Such variation can cause problems and unintended consequences when the electrical component is placed into use. The circuit loop described herein minimizes the impact of process variation by using an individually selectable bank of electrical components to obtain a desired electrical component value, as opposed to a single electrical component of a stated value.

Figure 1:
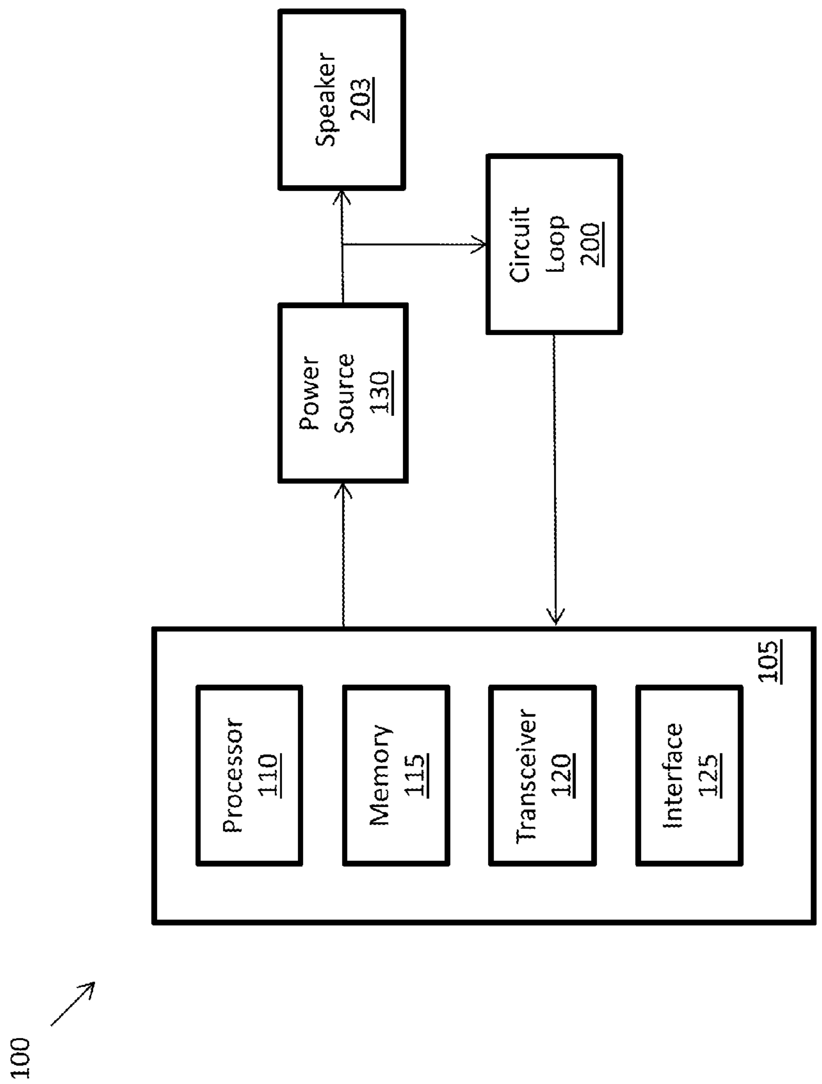
FIG. 1 is a block diagram of a thermal protection system for a speaker in accordance with an illustrative embodiment.

FIG. 1 is a block diagram of a thermal protection system 100 for a speaker 203 in accordance with an illustrative embodiment. The thermal protection system 100 includes a computing device 105, a power source 130, the speaker 203, and a circuit loop 200. In alternative embodiments, the thermal protection system 100 can include fewer, additional, and/or different components. The speaker 203 can be any type of electronic speaker that is driven by a load current. For example, the speaker 203 may be a home stereo speaker, a car speaker, a loudspeaker, an earphone speaker, a hearing aid, a phone speaker, a wireless speaker, etc. The power source 130 can be an electrical outlet, a cord or other component that receives electricity from an electrical outlet, a battery, or any other source that can provide a load current to the speaker 203.

In an illustrative embodiment, the circuit loop 200 is configured to monitor the load current that is input to the speaker 203 from the power source 130. If the load current to the speaker exceeds a threshold value, the circuit loop 200 can generate an instruction to turn off the speaker 203 by causing the power source 130 to stop providing the load current to the speaker 203. Alternatively, the circuit loop 200 can generate an instruction to reduce the load current supplied by the power source 130 to an acceptable level in the event that the load current exceeds the threshold value. The threshold value for load current can be the maximum current that the speaker can handle without risk of causing thermal damage to the speaker. The threshold value for load current can be different for speakers of different types, sizes, ratings, etc. If the load current remains less than the threshold value, the circuit loop 200 can either take no action or generate an instruction to leave the speaker in an on state. As discussed in more detail below with reference to FIG. 2, the circuit loop 200 includes both a first on-chip resistor to measure the load current through the speaker 203, and a second on-chip resistor that substantially negates the effect of the temperature coefficient of resistance of the first on-chip resistor during the load current measurement.

In the event that the circuit loop 200 determines that the threshold value for load current has been exceeded, the circuit loop 200 sends an instruction to the computing device 105. Upon receipt of the instruction, the computing device 105 either causes the power source 130 to stop supplying the load current to the speaker 203, or causes the power source 130 to supply a lower load current to the speaker 203. As a result, the speaker 203 is protected from thermal damage. The computing device 105 includes a processor 110, a memory 115, a transceiver 120, and an interface 125. In alternative embodiments, the computing device 105 can include additional, fewer, and/or different components. The processor 110 can be any processing device known to those of skill in the art. Likewise, the memory 115 can be any type of computer memory/storage known to those of skill in the art. The memory 115 can be used to store instructions that, upon execution by the processor, cause the computing device 105 to perform actions such as turning the speaker 203 off or lowering the load current in response to a received instruction. The transceiver 120 can receive and transmit data, such as control instructions, through a wired or wireless connection. The interface 125 can be a display, touchscreen, mouse, keyboard and/or other component that allows a user to interact with the computing device 105.

In an alternative embodiment, the functionality and/or components of computing device 105 may be incorporated into the circuit loop 200 such that the circuit loop 200 controls the power source 130 of the speaker 203 based on the monitoring of the load current. In another alternative embodiment, the computing device 105 can be replaced by a controller that is configured to switch the power source 130 off or reduce the load current supplied by the power source 130 in response to a received instruction from the circuit loop 200. In one embodiment, such a controller can be incorporated into the circuit loop 200 as a switch that is able to place the speaker 203 into an off state if the load current exceeds the threshold value. In an illustrative embodiment, the computing device 105 (or alternatively a controller), the power source 130, and the circuit loop 200 can be incorporated into a housing of the speaker 203. In an alternative embodiment, the circuit loop 200 and/or the computing device 105 (or alternatively the controller) may be remote from the speaker 203.

Figure 2:
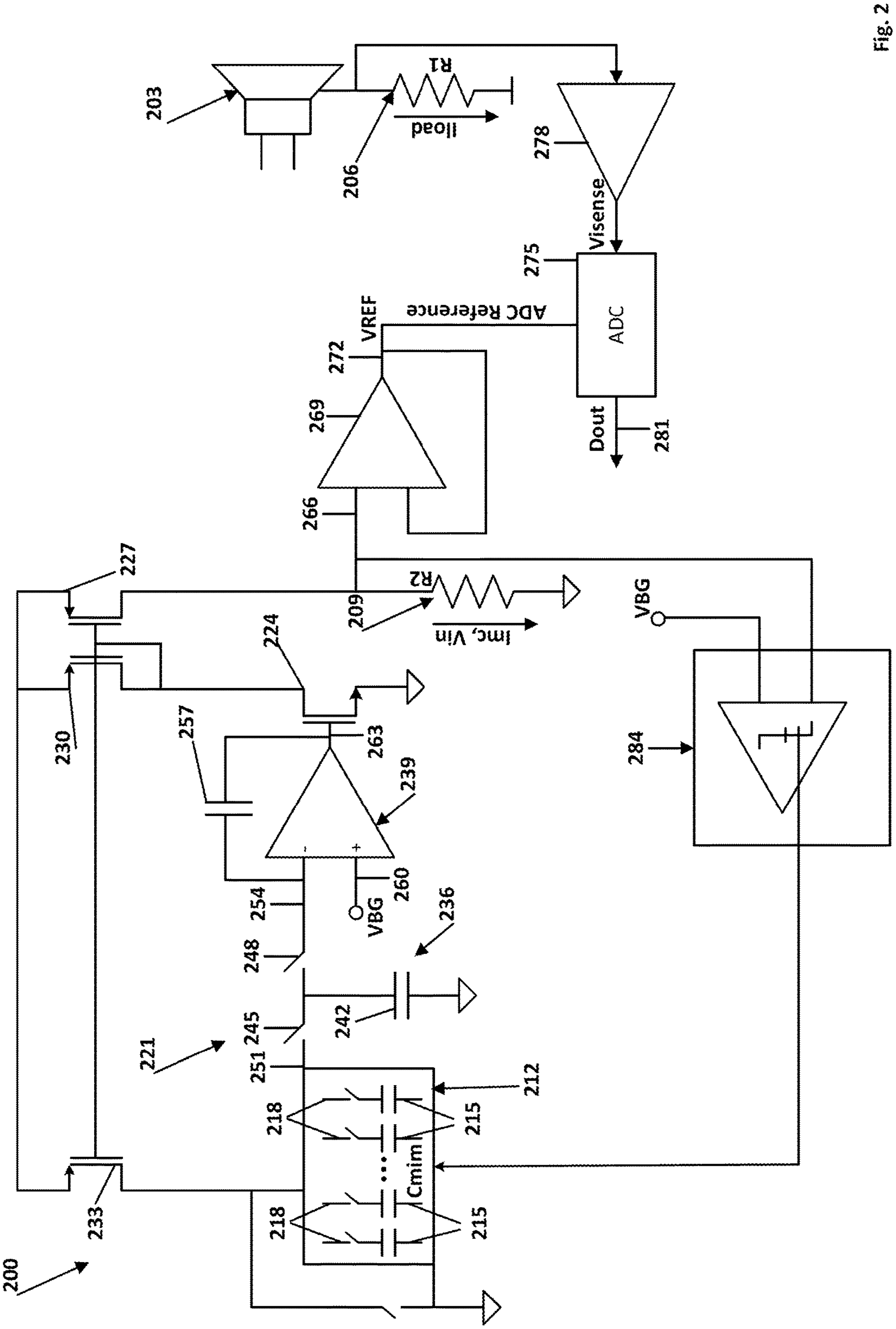
FIG. 2 is a circuit diagram depicting a loop configured to monitor the load current of a speaker in accordance with an illustrative embodiment.

FIG. 2 illustrates a detailed view of the circuit loop 200 configured to monitor the load current of the speaker 203 in accordance with an illustrative embodiment. The circuit loop 200 is intended to protect the speaker 203 from excessive heat damage by reducing the effect that temperature coefficient of resistance of a first on-chip resistor 206 has on load current (Iload) measurement. As discussed above, the temperature coefficient of resistance is an inherent property of a resistor which causes the resistance of the resistor to change as the temperature of the resistor changes. Using Ohm's Law, it is well established that Current=Voltage/Resistance. It follows that an increase in resistance due to the temperature coefficient of the resistor will make a measured load current value appear to be less than it really is. It is also well established that the load current is proportional to the amount of heat generated within the speaker. As a result, an inaccurate measurement of the load current will result in an inaccurate estimate of the amount of heat to which the speaker is being subjected.

The effect of the temperature coefficient of resistance of the first on-chip resistor 206 is reduced by introducing a second on-chip resistor 209 into the circuit loop 200. Although the description herein describes the resistors 206 and 209 as on-chip resistors, it is to be understood that other types of resistors may be used to implement the disclosed embodiments. In an illustrative embodiment, the second on-chip resistor 209 and the first on-chip resistor 206 are the same type of resistor such that they have the same temperature coefficient of resistance. The second on-chip resistor 209 and the first on-chip resistor 206 can have different values of resistance. Alternatively, the second on-chip resistor 209 can be selected such that the resistance of the second on-chip resistor 209 is equal to or substantially equal to the resistance of the first on-chip resistor 206. The second on-chip resistor 209 serves to cancel the effect of the first on-chip resistor 206 by ensuring that a reference voltage, VREF, is substantially equal in value to a band gap reference voltage, VBG (i.e., the VREF temperature coefficient tracks that of the second on-chip resistor 209). The first on-chip resistor 206 is referred to as R1 in FIG. 2 and in several of the equations included herein, while the second on-chip resistor 209 is referred to as R2.

The circuit loop 200 causes the reference voltage, VREF, to be fixed to the band gap reference voltage, VBG, by using a capacitor bank 212 having a plurality of capacitors 215 connected in parallel. In at illustrative embodiment, each of the plurality of capacitors 215 is a fixed capacitor. Each of the plurality of capacitors 215 is coupled to a switch 218 that allows individual capacitors 215 to be coupled to or removed from the circuit loop 200. Specifically, by opening the switch 218 of a respective one of the plurality of capacitors 215, that respective capacitor is removed (or disconnected) from the circuit loop 200. Similarly, by closing the switch 218 of a respective one of the plurality of capacitors 215, that respective capacitor is added (or coupled) to the circuit loop 200. Thus, each of the plurality of capacitors 215 may be individually controlled to selectively add or remove the number of capacitors within the capacitor bank 212 until the reference voltage, VREF, has the same value as the band gap reference voltage, VBG. By virtue of varying the number of capacitors 215 within the capacitor bank 212 that are coupled to the circuit loop 200 at any given time, any process variations resulting from the manufacturing of the plurality of capacitors and the second on-chip resistor 209 may be accounted for, while still ensuring that the reference voltage, VREF, is substantially fixed to the band gap reference voltage, VBG. The capacitor bank 212 and its function are described in more detail below.

Notwithstanding the configuration of the capacitor bank 212 and the plurality of capacitors 215 described above, various modifications of the capacitor bank and the plurality of capacitors are contemplated and considered within the scope of the present disclosure. For example, even though the plurality of capacitors 215 have been described as being fixed capacitors, in at least some embodiments, one or more of the plurality of capacitors may be other types of capacitors, such as, polarized or variable capacitors. Similarly, while the plurality of capacitors 215 have been described as being connected in parallel to one another, in other embodiments, those capacitors may be connected in series or a combination of series and parallel capacitors may be used, so long as the voltage across the capacitor bank may be suitably varied to fix the reference voltage, VREF, to the band gap reference voltage, VBG, within the circuit loop 200. Likewise, while each of the plurality of capacitors 215 has been described as having the switch 218, in at least some embodiments, multiple ones of the plurality of capacitors may share a switch or a different configuration of the switch may be used for selectively adding and removing one or more of the plurality of capacitors from the circuit loop 200.

As illustrated in FIG. 2, the capacitor bank 212 is coupled to the second on-chip resistor 209 (R2) through a non-inverting charge amplifier 221 and a combination of n-channel and p-channel metal oxide semiconductor field effect transistor (MOSFET) circuits 224, 227, 230, and 233. The non-inverting charge amplifier 221 includes a switched capacitor 236 coupled to the capacitor bank 212 on one end and to an operational amplifier 239 on the other. The switched capacitor 236 includes a capacitor 242 and control switches 245 and 248 to transfer charge into and out of the capacitor as the control switches are closed and opened, respectively. Non-overlapping clocks may be used to control the opening and closing of the control switches 245 and 248, such that in each switching cycle, a charge from an input node 251 (e.g., from the capacitor bank 212) is transferred to an output node 254 (e.g., input to the operational amplifier 239).

By virtue of using non-overlapping clocks to control the control switches 245 and 248, only one of those switches may be closed at a time. Specifically, when the control switch 245 is closed (e.g., due to the clock of the control switch 245 being high) and the control switch 248 is open (e.g., due to the clock of the control switch 248 being low), the capacitor 242 is charged with the voltage at the input node 251 (e.g., voltage across the capacitor bank 212). When the control switch 245 is open and the control switch 248 is closed (e.g., due to the clock of the control switch 248 being high and the clock of the control switch 245 being low), at least some of the charge on the capacitor 242 may be drained out to the output node 254 to charge a feedback capacitor 257 of the operational amplifier 239. Thus, by transferring voltage from the input node 251 to the output node 254, the switched capacitor 236 effectively acts like a resistor whose value depends upon the value of the capacitor 242, as well as the switching frequency of the control switches 245 and 248. The switched capacitor 236 is used to generate a temperature insensitive current source in the form of MOSFET circuit 227. The output current of MOSFET circuit 227 dumps on the second on-chip resistor 209 to generate VREF such that the temperature coefficient of VREF matches that of the second on-chip resistor 209.

In at least some embodiments, the output node 254 of the switched capacitor 236 is an inverting input into the operational amplifier 239, while the band gap reference voltage, VBG, is coupled to a non-inverting input 260 of the operational amplifier 239. Thus, the operational amplifier 239 is a non-inverting operational amplifier, which utilizes the feedback from the feedback capacitor 257 to amplify the band gap reference voltage, VBG, by the voltage gain of the operational amplifier at an output 263 of the operational amplifier. The output 263 of the operational amplifier 239 is used to control the n-channel MOSFET circuit 224.

The MOSFET circuits 224, 227, 230, and 233, as well as the non-inverting charge amplifier 221 control the current, Imc, across the second on-chip resistor 209 by varying the voltage generated by the capacitor bank 212. The current, Imc, across the second on-chip resistor 209 is given by:

$$Imc=2*VBG*Cmim/Tclk, \qquad \text{Equation 1}$$

where Cmim is the total capacitance of the capacitor bank 212 and Tclk is the clock period of Cmim.

Applying Ohm's Law (Voltage=Current*Resistance), the voltage, Vin, across the second on-chip resistor 209 is given by:

$$Vin=(2*VBG*Cmim/Tclk)*R2. \qquad \text{Equation 2}$$

The voltage, Vin, across the second on-chip resistor 209 may also be fed as input 266 into a voltage follower 269. The voltage follower 269 adjusts its output voltage 272 to closely track the voltage at the input 266. Therefore, the output voltage 272 which may be designated as the reference voltage, VREF, is controlled to be substantially equal to the voltage, Vin, across the input 266 of the voltage follower 269. This is expressed in Equation 3 below:

$$VREF=Vin=(2*VBG*Cmim/Tclk)*R2(1+Tc*T), \qquad \text{Equation 3}$$

where Tc is the temperature coefficient and T is the temperature.

The voltage, Visense, across the speaker 203 can be calculated using the current load, Iload, across the first on-chip resistor 206. Applying Ohm's Law:

$$Visense=R1(1+Tc*T)*Iload. \qquad \text{Equation 4}$$

The voltage, Visense, is fed into an analog to digital converter ("ADC") 275 via a buffer 278. Relatedly, the reference voltage, VREF, from the output 272 of the voltage follower 269 is fed into the analog to digital converter 275. The analog to digital converter 275 can utilize the reference voltage, VREF, as a reference voltage input to perform the digital to analog conversion of the voltage across the first on-chip resistor 206. The ADC 275 also includes a comparator to determine whether the voltage across the speaker 203, Visense, is greater than a threshold voltage, where the threshold voltage is based on the operational rating of the speaker. Alternatively, the ADC and its comparator can convert and analyze current through the speaker 203. In an illustrative embodiment, the analog to digital converter 275 can be configured such that an output, Dout 281, of the analog to digital converter is given by:

$$\text{Dout}=\text{Visense}/\text{VREF}*(2^n-1)=(R*(1+Tc*T)*\text{Iload})/(R2*(1+Tc*T)*2*\text{VBG}*\text{Cmim}/\text{Tclk})*(2^n-1), \quad \text{Equation 5}$$

where n is the number of bits in the ADC.

As discussed above, the temperature coefficient of resistance of the first on-chip resistor 206 is the same as the temperature coefficient of resistance of the second on-chip resistor 209. Therefore, the temperature dependency of R1 and R2 in Equation 5 above cancel out, resulting in:

$$\text{Dout}=\text{Iload}*R1/(R2*2*\text{VBG}*\text{Cmim}/\text{Tclk})*(2^n-1)=\text{Iload}/\text{Imc}*R1/R2*(2^n-1). \quad \text{Equation 6}$$

The analog to digital converter 275 can continuously compare the load current (or voltage) at the first on-chip resistor 206 to the threshold value based on the rating of the speaker to generate an output. If the analog to digital converter 275 determines that the load current Iload of the first on-chip resistor 206 is less than the threshold value, the output can be a first value (e.g., low). If the analog to digital converter 275 determines that the load current Iload of the first on-chip resistor 206 equals or exceeds the threshold value, the output can be set a second value (e.g., high). Alternatively, the values assigned to the output based on the comparison may be reversed. In the event of the output having a high value, a controller or other device (such as computing device 105) can be used to either turn the speaker 203 off or reduce the load current Iload to the speaker. As a result, thermal damage to the speaker can be avoided. Additionally, any effects of the temperature coefficient of resistance of the first on-chip resistor 206 are canceled by inclusion of the second on-chip resistor 209, as illustrated above in Equations 5-6. The capacitors of the capacitor bank 212 also have an associated temperature coefficient that affects the accuracy of the Iload measurement. However, the temperature coefficient of the capacitor bank 212 is approximately an order of magnitude lower than the temperature coefficient of resistance associated with the first on-chip resistor 206. As such, use of the second on-chip resistor 209 in the circuit loop 200 significantly increases the accuracy of the measured load current Iload across the first on-chip resistor 206.

In addition to feeding the voltage, Vin, across the second on-chip resistor 209 into the voltage follower 269, that voltage is also fed into a hysteresis comparator 284 for automatically controlling the capacitor bank 212. Specifically, the hysteresis comparator 284 compares the voltage, Vin, across the second on-chip resistor 209 with the band gap reference voltage, VBG and determines whether the voltage, Vin, across the second on-chip resistor 209 is less than or greater than the band gap reference voltage, VBG. Thus, for example, if the voltage, Vin, across the second on-chip resistor 209 is less than the band gap reference voltage, VBG, the hysteresis comparator 284 can direct the capacitor bank 212 to add one or more of the plurality of capacitors 215 to the circuit loop 200 to increase the voltage across the capacitor bank 212, such that the reference voltage, VREF, is substantially equal in value to the band gap reference voltage, VBG. Likewise, if the voltage, Vin, across the second on-chip resistor 209 is more than the band gap reference voltage, VBG, the hysteresis comparator 284 can direct the capacitor bank 212 to remove one or more of the plurality of capacitors 215 from the circuit loop 200 to decrease the value of voltage across the capacitor bank such that, again, the value of the reference voltage, VREF, tracks the value of the band gap reference voltage, VBG. Thus, the circuit loop 200 automatically monitors the reference voltage, VREF, and modifies the voltage within the circuit loop 200 such that the reference voltage, VREF, closely tracks the band gap reference voltage, VBG, to prevent thermal damage to the speaker 203. In an illustrative embodiment, this process occurs only when the chip is powered on, and the hysteresis comparator 284 can be in an off state during current sensing operations. In another illustrative embodiment, code to control the capacitor bank 212 can be stored in memory.

Figure 3:
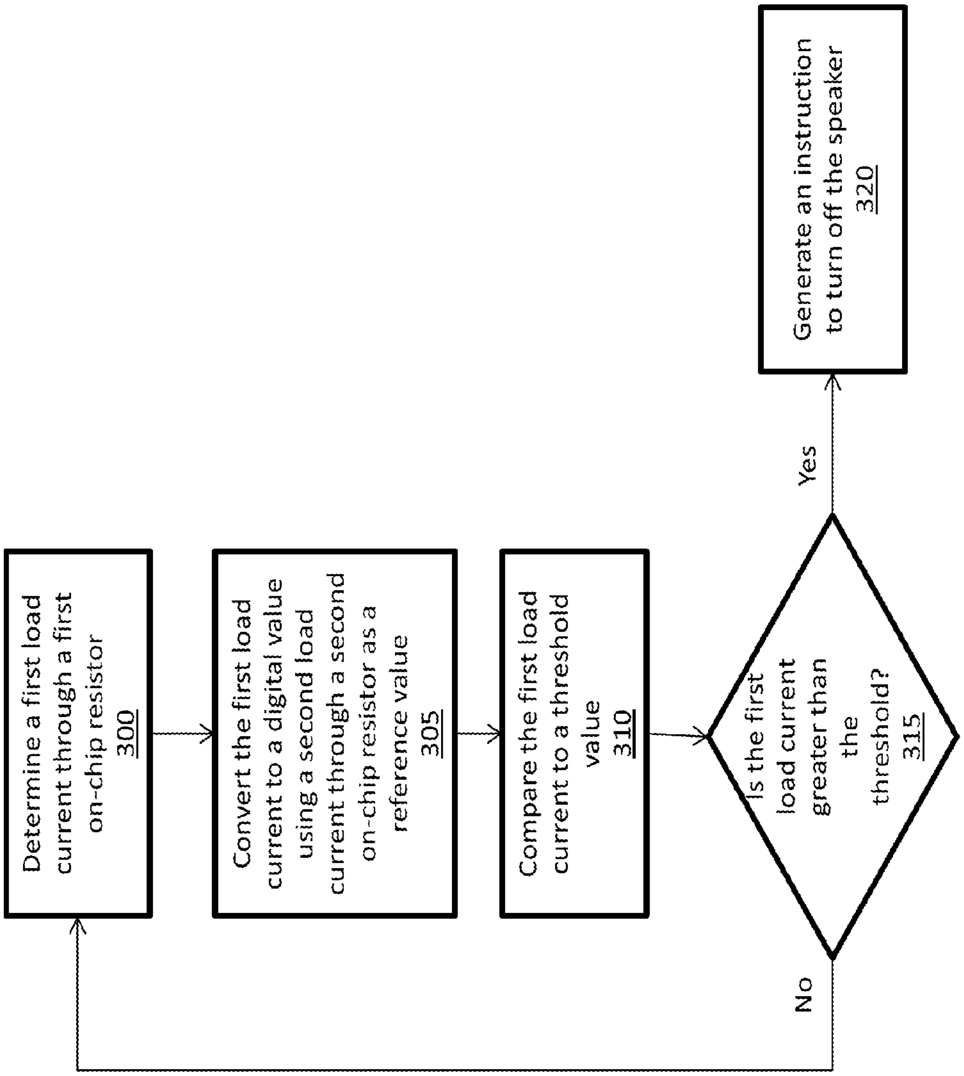
FIG. 3 is a flow diagram depicting a process for protecting a speaker from overheating in accordance with an illustrative embodiment.

FIG. 3 is a flow diagram depicting operations performed in a process for protecting a speaker from overheating in accordance with an illustrative embodiment. Additional, fewer, or different operations may be performed depending on the implementation of the process. The process can be implemented by a system such as the thermal protection system 100 described with reference to FIG. 1. In an operation 300, the system determines a first load current through a first on-chip resistor, such as the first on-chip resistor 206 described with reference to FIG. 2. In an operation 305, the system converts the first load current to a digital value using a second load current through a second on-chip resistor, such as the second on-chip resistor 209 described with reference to FIG. 2, as a reference value. In an illustrative embodiment, the first load current and the second load current are determined using Equations 5 and 6 above such that the temperature coefficient of resistance of the first on-chip resistor does not affect the determination of the first load current.

In an operation 310, the system compares the digital value of the first load current to a threshold value that is based on the rating of the speaker. The comparison can be performed by a comparator that is included in or connected to the analog to digital converter 275 described with reference to FIG. 2. Alternatively, the comparison may be performed by a computing device that includes a processing component. If it is determined in an operation 315 that the first load current is less than the threshold, no action is taken and the process continues to monitor and compare the load currents in the operations 300-310. If it is determined in the operation 315 that the first load current is greater than the threshold, the system generates an instruction to turn off the speaker in an operation 320. In one embodiment, the instruction can be directly or indirectly provided to a power source (such as the power source 130) of the speaker such that the speaker is turned off. In an alternative embodiment, the instruction can be to reduce the load current to the speaker, while leaving the speaker in an on state. In addition, while FIG. 3 discusses monitoring of current and use of a current threshold, other electrical values such as voltages can also be monitored and compared to a threshold to protect the speaker.

In an illustrative embodiment, any of the operations described herein can be implemented at least in part as computer-readable instructions stored on a computer-readable medium, such as a computer memory or storage device. Upon execution of the computer-readable instructions by a processor, the computer-readable instructions can cause the computing device to perform the operations.

The foregoing description of illustrative embodiments has been presented for purposes of illustration and of description. It is not intended to be exhaustive or limiting with respect to the precise form disclosed, and modifications and variations are possible in light of the above teachings or may be acquired from practice of the disclosed embodiments. It is intended that the scope of the invention be defined by the claims appended hereto and their equivalents.

What is claimed is:

1. A method of protecting a speaker from thermal damage, the method comprising:

determining a first load current through a first resistor that is coupled to the speaker;

converting the first load current to a digital value using a second load current through a second resistor as a reference input, wherein the second resistor is part of a circuit that reduces an effect of a temperature coefficient of resistance of the first resistor;

comparing the digital value of the first load current to a threshold value; and responsive to the first load current being larger than the threshold value, generating an instruction to take an action to protect the speaker.

2. The method of claim 1, wherein the action to protect the speaker comprises turning the speaker off.

3. The method of claim 2, further comprising controlling a power source of the speaker to turn the speaker off.

4. The method of claim 1, wherein the action to protect the speaker comprises reducing the first load current that is provided to the speaker through the first resistor.

5. The method of claim 1, wherein the first resistor and the second resistor have a same temperature coefficient.

6. The method of claim 1, further comprising:

feeding a voltage across the second resistor into a hysteresis comparator of the circuit;

comparing the voltage across the second resistor to a band gap reference voltage that serves as an input to the circuit; and controlling an individually selectable bank of capacitors based on the comparing.

7. The method of claim 6, wherein the controlling comprises adding one or more capacitors of the individually selectable bank of capacitors to the circuit in response to the voltage across the second resistor being less than the band gap reference voltage.

8. The method of claim 7, wherein the adding the one or more capacitors to the circuit increases a voltage across the individually selectable bank of capacitors and causes a reference voltage to track the band gap reference voltage.

9. The method of claim 6, wherein the controlling comprises removing one or more capacitors of the individually selectable bank of capacitors from the circuit in response to the voltage across the second resistor being greater than the band gap reference voltage.

10. The method of claim 9, wherein the removing the one or more capacitors from the circuit decreases a voltage across the individually selectable bank of capacitors and causes a reference voltage to track the band gap reference voltage.

11. The method of claim 6, wherein the controlling of the individually selectable bank of capacitors accounts for process variation in capacitors of the individually selectable bank of capacitors.

12. The method of claim 6, wherein the controlling of the individually selectable bank of capacitors accounts for process variation in the second resistor.

13. The method of claim 1, wherein the comparing of the first load current to the threshold is performed by a comparator of an analog to digital converter.

14. A circuit for protecting a speaker from thermal damage, the circuit comprising:

an analog to digital converter that is configured to:

receive a first load current that flows through a first resistor that is coupled to the speaker and a second load current that flows through a second resistor, wherein the second resistor reduces an effect of a temperature coefficient of resistance of the first resistor;

convert the first load current to a digital value with the second load current as a reference value;

compare the digital value of the first load current to a threshold value; and responsive to the first load current being larger than the threshold value, generate an instruction to take an action to protect the speaker; and a controller configured to receive the instruction from the analog to digital converter and to perform the action.

15. The circuit of claim 14, wherein the action to protect the speaker comprises turning the speaker off.

16. The circuit of claim 15, wherein the controller is configured to control a power source of the speaker to turn the speaker off.

17. The circuit of claim 14, wherein the action to protect the speaker comprises reducing the first load current to the speaker, and wherein the controller is configured to control a power source of the speaker to reduce the first load current.

18. The circuit of claim 14, wherein the controller comprises a switch that is controlled in response to the generated instruction.

19. The circuit of claim 14, wherein the controller comprises a computing device that is in communication with both the analog to digital converter and a power source of the speaker.

20. The circuit of claim 14, wherein the analog to digital converter includes a comparator to perform the comparison of the first load current to the threshold value.

21. The circuit of claim 14, further comprising:

an individually selectable bank of capacitors; and a hysteresis comparator that is configured to:

receive a voltage across the second resistor;

compare the voltage across the second resistor to a band gap reference voltage that serves as an input to the circuit; and control the individually selectable bank of capacitors based on the comparison of the voltage across the second resistor to the band gap reference voltage.

22. The circuit of claim 21, wherein the hysteresis comparator is configured to couple one or more capacitors of the individually selectable bank of capacitors to the circuit in response to the voltage across the second resistor being less than the band gap reference voltage.

23. The circuit of claim 22, wherein coupling of the one or more capacitors to the circuit increases a voltage across the individually selectable bank of capacitors and causes a reference voltage to track the band gap reference voltage.

24. The circuit of claim 21, wherein the hysteresis comparator is configured to remove one or more capacitors of the individually selectable bank of capacitors from the circuit in response to the voltage across the second resistor being greater than the band gap reference voltage.

25. The circuit of claim 24, wherein the removal of the one or more capacitors from the circuit decreases a voltage across the individually selectable bank of capacitors and causes a reference voltage to track the band gap reference voltage.

26. The circuit of claim 21, wherein the control of the individually selectable bank of capacitors accounts for process variation in capacitors of the individually selectable bank of capacitors and process variation in the second resistor.

27. An apparatus for protecting a speaker from thermal damage, the apparatus comprising:

means for determining a first load current through a first resistor that is coupled to the speaker;

means for converting the first load current to a digital value, wherein the means for converting is configured to use a second load current through a second resistor as a reference value, and wherein the second resistor is part of a circuit that reduces an effect of a temperature coefficient of resistance of the first resistor;

means for comparing the digital value of the first load current to a threshold value; and responsive to the first load current being larger than the threshold, means for generating an instruction to take an action to protect the speaker.

28. The apparatus of claim 27, further comprising:

means for comparing a voltage across the second resistor to a band gap reference voltage that serves as an input to the circuit; and means for controlling an individually selectable bank of capacitors based on the comparison of the voltage across the second resistor to the band gap reference voltage such that a reference voltage of the circuit tracks the band gap reference voltage.

29. The apparatus of claim 27, wherein the first resistor and the second resistor have a same temperature coefficient.

30. A non-transitory computer-readable medium having computer-readable instructions stored thereon, the computer-readable instructions comprising:

instructions to determine a first load current through a first resistor that is coupled to the speaker;

instructions to convert the first load current to a digital value using a second load current through a second resistor as a reference input, wherein the second resistor is part of a circuit that reduces an effect of a temperature coefficient of resistance of the first resistor;

instructions to compare the digital value of the first load current to a threshold value; and instructions to take, responsive to the first load current being larger than the threshold value, an action to protect the speaker.

* * * * *